United States Patent
Yu et al.

(10) Patent No.: US 7,363,966 B2
(45) Date of Patent: Apr. 29, 2008

(54) HEAT DISSIPATING DEVICE

(75) Inventors: Guang Yu, Shenzhen (CN); Hsieh-Kun Lee Lee, Tu-Cheng (TW); Cui-Jun Lu, Shenzhen (CN)

(73) Assignees: Fu Zhun Precision Industry (Shenzhen) Co., Ltd., Bao'an District, Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 358 days.

(21) Appl. No.: 11/135,628

(22) Filed: May 23, 2005

(65) Prior Publication Data

US 2006/0144572 A1 Jul. 6, 2006

(30) Foreign Application Priority Data

Dec. 30, 2004 (CN) .................. 2004 2 0103598 U

(51) Int. Cl.
*F28D 15/00* (2006.01)
(52) U.S. Cl. .............................. 165/104.33; 165/104.21
(58) Field of Classification Search ........... 165/104.21, 165/104.26, 104.33, 121, 80.1–80.3; 361/697, 361/700
See application file for complete search history.

(56) References Cited

U.S. PATENT DOCUMENTS 6,189,601 B1 * 2/2001 Goodman et al. ......... 165/80.3

| 6,779,595 | B1 | 8/2004 | Chiang |
| 2004/0035558 | A1 | 2/2004 | Todd et al. |
| 2004/0190261 | A1 * | 9/2004 | Lopatinsky et al. ........ 361/704 |
| 2005/0183849 | A1 * | 8/2005 | Ko et al. ................ 165/104.33 |

FOREIGN PATENT DOCUMENTS

| CN | 2514400 Y | 2/2002 |
| CN | 2605665 Y | 3/2004 |
| TW | 326939 | 2/1998 |
| TW | 592340 | 6/2004 |

* cited by examiner

*Primary Examiner*—Teresa J. Walberg
(74) *Attorney, Agent, or Firm*—Morris Manning Martin LLP; Tim Tingkang Xia, Esq.

(57) ABSTRACT

A heat dissipating device (1) includes a heat spreader (10), a radiator (2), at least one U-shaped heat pipe (12), a fan (3) mounted on the radiator and a pair of clips (4). The radiator includes a first heat sink (20) and a second heat sink (22). The first heat sink (20) includes a first base (200) and a plurality of fins (202) extending from a side of the first base. The second heat sink (22) includes a second base (220) and a plurality of fins (222) extending from a side of the second base. The heat pipe (12) includes an evaporating portion (120) attached to the heat spreader and a pair of condensing portions (122) extending upwardly from opposite ends of the evaporating portion. The two condensing portions are sandwiched between the first base and the second base. The heat pipe transfers heat from the heat spreader to both of the first base and second base.

19 Claims, 3 Drawing Sheets

HEAT DISSIPATING DEVICE

BACKGROUND

1. Field

The present invention relates generally to heat dissipating devices for removing heat from heat-generating devices, and more particularly to a heat dissipating device having great heat dissipation efficiency for cooling electronic devices such as Central Processing Units (CPUs).

2. Prior Art

Computer electronic devices such as central processing units (CPUs) generate lots of heat during normal operation. If not properly removed, such heat can adversely affect the operational stability of the computer electronic devices. Solutions must be taken to efficiently remove the heat from the CPUs. Typically, a heat sink is mounted on a CPU to remove the heat therefrom.

Conventional heat sinks such as aluminum extrusion type heat sinks are widely used for heat dissipation of electronic devices. However, the aluminum extrusion heat sinks, which each commonly include a flat base and a plurality of fins extending upwardly from the base, have many drawbacks. The first drawback is that the total surface area of the fins available for heat dissipation is very limited as the made space between adjacent fins cannot be desirably small enough. This drawback seriously bars improvement of the heat removal rate of the aluminum extrusion heat sinks. Another drawback is that the heat generated by heat sources cannot be rapidly transferred to remote portions of the fins so that the remote portions have a relatively lower heat dissipation effect. This also limits heat dissipation efficiency of the heat sinks.

To solve the aforesaid drawbacks of aluminum extrusion type heat sinks, another kind of heat sink having a T-shaped base and a plurality of fins, has been developed. The performance of this kind of heat sink is greater than aforesaid aluminum extrusion type heat sinks. However, heat still is transferred to the fins by a conventional conduction which is slow in nature. Taiwan Patent Issue No. 326939 shows an example of this kind of heat sinks. However, since the heat intensity generated by the heat source is increased significantly in recently developed computer electronic devices, this kind of heat sinks which cannot dissipate heat quickly enough to remove the heat promptly from the heat source, can not meet the requirement of heat dissipation for the recently developed computer electronic devices.

Therefore, it is desired to design a novel heat dissipating device to overcome the aforementioned problems and increase the heat dissipation effect thereof.

SUMMARY

Accordingly, what is needed a heat dissipating device which removes heat from a heat-generating device rapidly and has a satisfactory heat dissipation effect.

A heat dissipating device for removing heat from a heat-generating device in accordance with a preferred embodiment of the present invention comprises a heat spreader, a radiator, at least one U-shaped heat pipe, a fan mounted on the radiator and a pair of clips. The radiator comprises a first heat sink and a second heat sink. The first heat sink comprises a first base and a plurality of fins extending from a side of the first base. The second heat sink comprises a second base and a plurality of fins extending from a side of the second base. The heat pipe comprises an evaporating portion attached to the heat spreader and a pair of condensing portions extending upwardly from opposite ends of the evaporating portion. The two condensing portions are sandwiched between the first base and the second base. The heat pipe transfers heat from the heat spreader to both of the first base and second base.

Other advantages and novel features of the present invention will become more apparent from the following detailed description when taken in conjunction with the accompanying drawings, in which:

DETAILED DESCRIPTION OF THE PREFERRED EMBODIMENT

Figure 1:
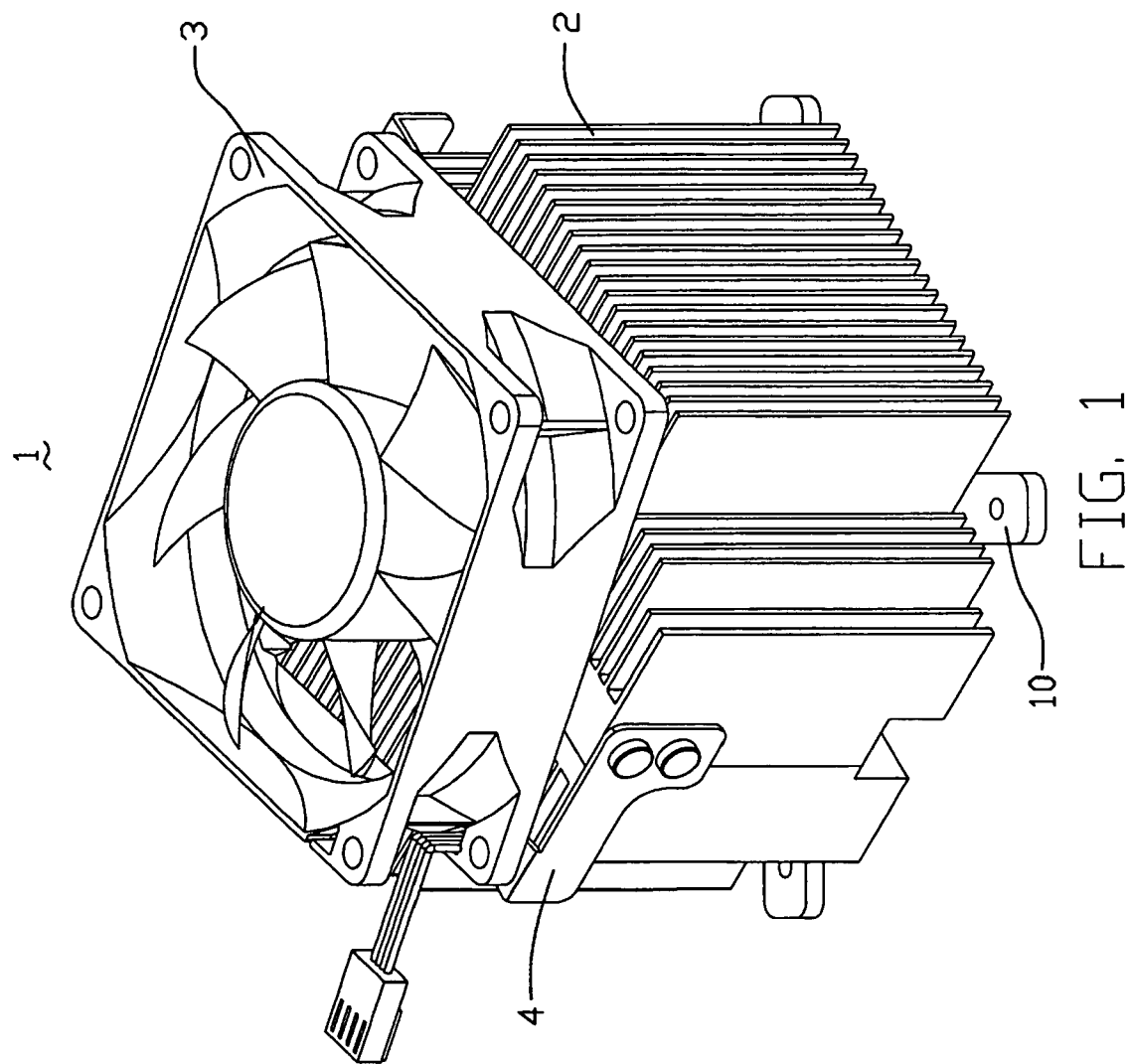
FIG. 1 is an assembled view of a heat dissipating device in accordance with one preferred embodiment of the present invention.

Reference will now be made to the drawing figures to describe a heat dissipating device 1 of a preferred embodiment in accordance with the present invention in detail.

Figure 2:
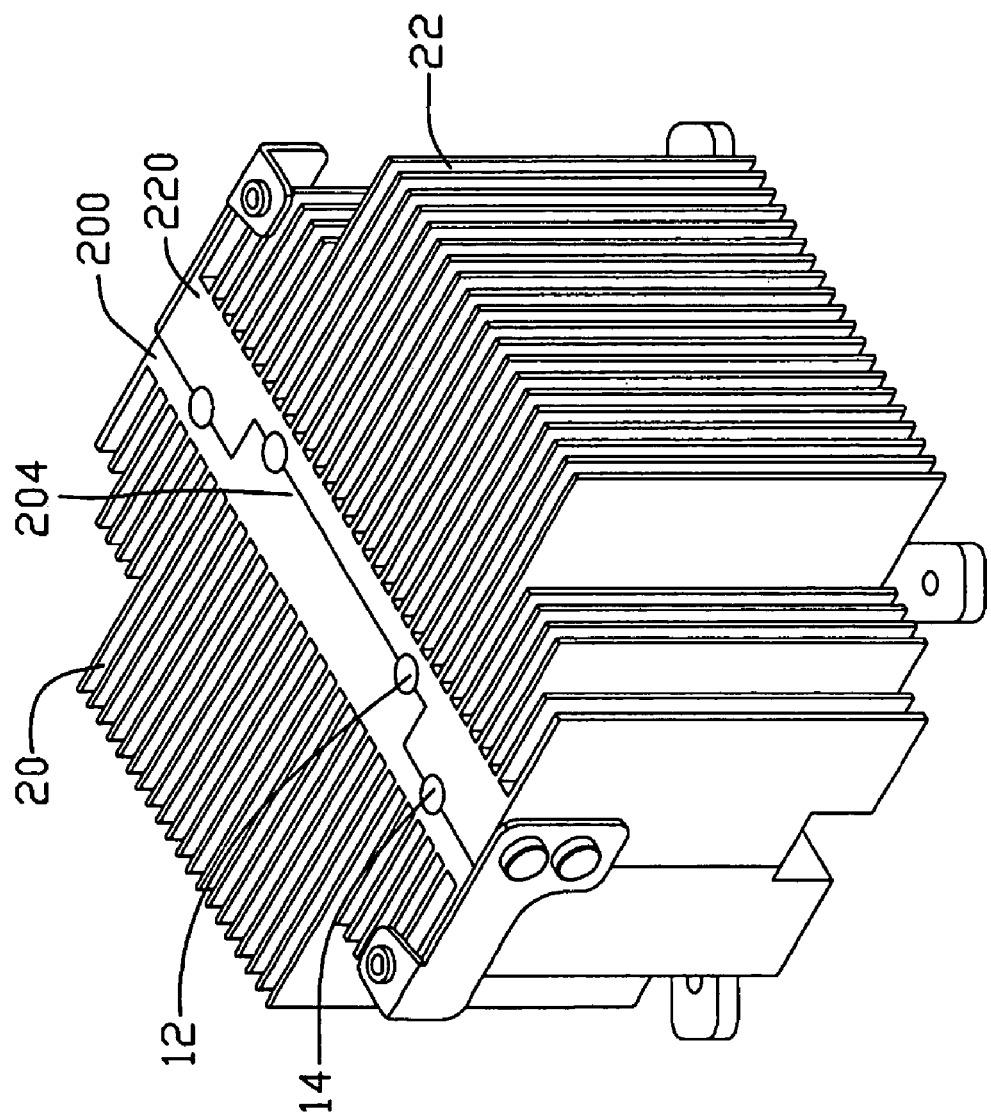
FIG. 2 is similar to FIG. 1 but without a fan of FIG. 1.
Figure 3:
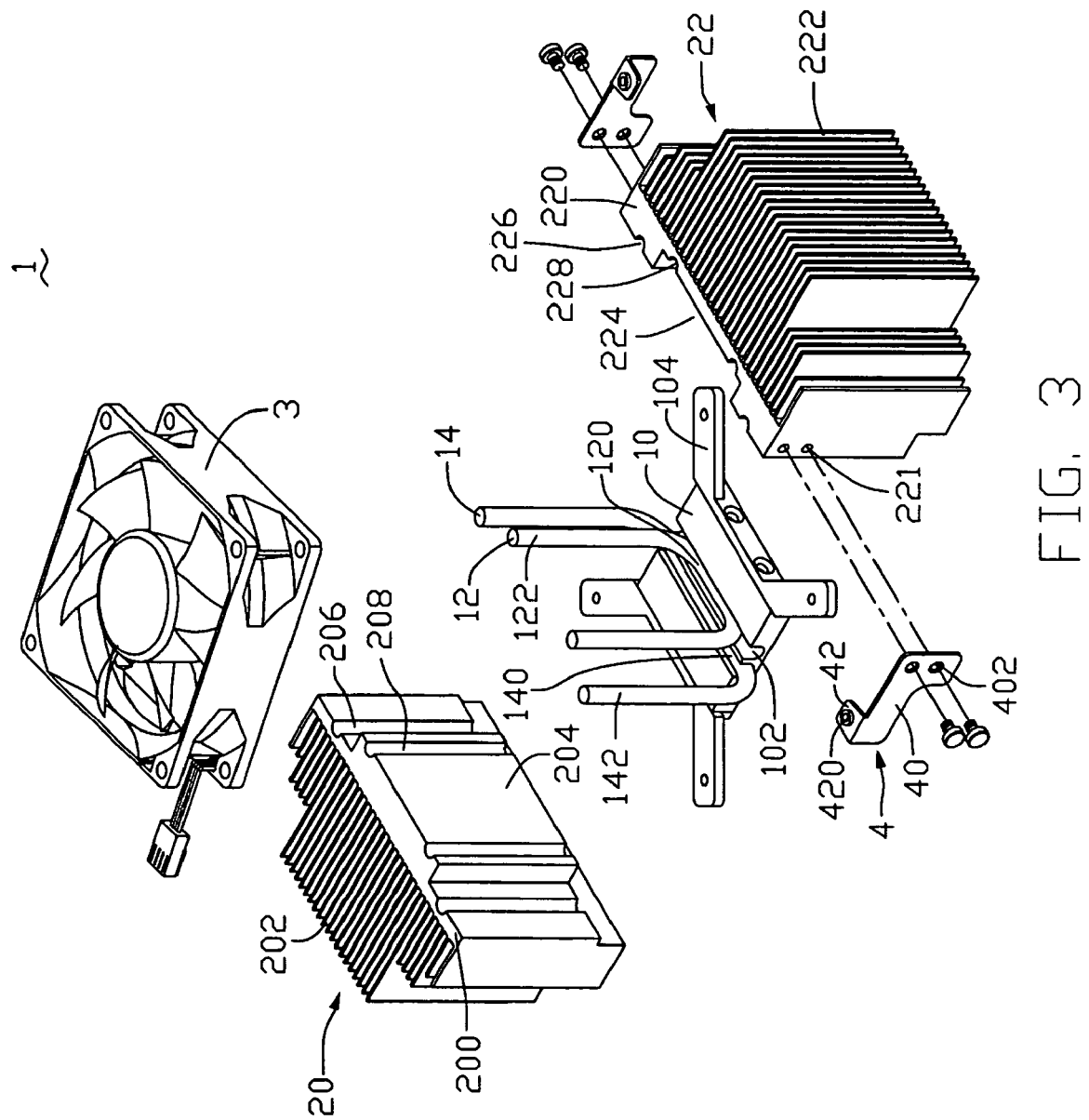
FIG. 3 is an exploded view of FIG. 1.

Referring FIG. 1 to FIG. 3, the heat dissipating device 1 comprises a heat spreader 10, a pair of U-shaped pipes 12, 14, a radiator 2, a fan 3 for mounting on the radiator 2 and a pair of clips 4.

The heat spreader 10 is preferably made of copper or aluminum material and has a bottom mating surface. The mating surface is adapted for contacting a heat source such as a CPU (not shown). The heat spreader 10 defines a pair of parallel grooves 102 in a top surface thereof, opposing the mating surface. The heat spreader 10 forms ears 104 extending outwardly at each corner thereof. The heat spreader 10 is fastened on the CPU by extending screws or bolts through the ears 104 to engage a retainer surrounding the CPU. The CPU and the retainer are not shown in the drawings.

The heat pipe 12 comprises a horizontal evaporating portion 120 and two condensing portions 122 extending perpendicularly from opposite ends of the evaporating portion 120. The heat pipe 14 juxtaposed to the heat pipe 12 comprises a horizontal evaporating portion 140 and two vertical condensing portions 142 at two ends of the evaporating portion. The length of the evaporating portion 120 is less than that of the evaporating portion 140. The evaporating portions 120, 140 of the heat pipes 12, 14 are fixedly received in the corresponding grooves 102 of the heat spreader 10 by soldering means or by other conventional means such that the evaporating portions 120, 140 and the heat spreader 10 are thermally connected together, which means heat received by the spreader 10 is immediately transferred to the evaporating portions 120, 140.

The radiator 2 comprises a first heat sink 20 and a second heat sink 22.

The first heat sink 20 is formed by extrusion, and comprises a first base 200 perpendicular to the heat spreader 10 and a plurality of parallel fins 202 extending laterally from a side of the first base 200. A pair of first grooves 206 is defined in the first base 200 near opposite front and rear sides thereof. A protrusion 204 is formed between the first grooves 206. A pair of second grooves 208 is defined in the protrusion 204. The grooves 206, 208 each have a semicircle cross-section.

The second heat sink 22 is also formed by extrusion, and comprises a second base 220 facing to the first base 200 of the first heat sink 20 and a plurality of parallel fins 222 extending laterally from a side of the second base 220. The second base 220 defines mounting holes 221 in front and rear sides thereof. A pair of first slots 226 is defined in the second base 220 near the front and rear sides thereof, corresponding to the first grooves 206. A recess 224 corresponding to the protrusion 204 of the first heat sink 20 is defined in the second base 220 between the first slots 226. A pair of second slots 228 corresponding to the second of grooves 208 is defined in the recess 224. The recesses 226, 228 each have a semicircle cross-section. The condensing portions 142 of the heat pipe 14 are correspondingly received in holes formed by the first grooves 206 and the first slots 208 after the first and second heat sinks 20, 22 are assembled together. The condensing portions 122 of the heat pipe 12 are correspondingly received in holes formed by the second grooves 208 and the second slots 228. The second base 220 contacts the first base 200. The protrusion 204 is intimately received in the recess 224.

The fan 3 is mounted on the radiator 2 via the clips 4 positioned on the opposite front and rear sides of the radiator 2. Each clip 4 comprises a body 40 being located on the second heat sink 22 and oriented parallel to the fins 222, and a tab 42 perpendicularly extending from a top of the body 40 for fixing the fan 3 onto the radiator 2. The body 40 defines locating holes 402 corresponding to the mounting holes 221 of the second base 220. In this embodiment, the clips 4 are fastened on the radiator 2 by engaging screws (not labeled) through the locating holes 402 into the mounting holes 221. The tab 42 extends from the body 40 at an end of the body distant from the locating holes 402. A bulge 420 is formed on the tab 42. A hole (not labeled) is defined in the bulge 420. The fan 3 has a generally square configuration. Two diagonal corners of the fan 3 are fastened to the clips 4 (best seen in FIG. 1) by engaging screws (not shown) through the fan 3 into the holes defined in the bulges 420 of the clips 4. Thus, the fan 3 is secured on a top of the first and second heat sinks 20, 22 of the radiator 2.

In assembly, the heat spreader 10 is attached to the CPU. The evaporating portions 120, 140 of the heat pipes 12, 14 are correspondingly embedded in the grooves 102 of the heat spreader 10. The first and second heat sinks 20, 22 are positioned on the heat spreader 10 so that the condensing portions 122, 142 of the heat pipes 12, 14 are sandwiched between the first and second bases 200, 220. The condensing portions 122, 142 are thermally connected to the bases 200, 220 of the heat sinks 20, 22. Heat accumulated on the heat spreader 10 can be immediately taken away to the bases 200, 220 of the heat sinks 20, 22 of the radiator 2 via the heat pipes 12, 14. The heat on the bases 200, 220 is subsequently transferred to the fins 202, 222 for being dissipated to atmosphere. The fan 3 mounted on the radiator 2 blows an air flow through the fins 202, 222 to enhance heat dissipating effectiveness of the fins 202, 222.

It is believed that the present invention and its advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A heat dissipating device comprising:
   a heat spreader;
   a first heat sink comprising a first base;
   a second heat sink comprising a second base; and
   a heat pipe comprising a first end attached to the heat spreader, and a second end sandwiched between the first base and the second base, the heat pipe transferring heat from the heat spreader to both of the first base and the second base;
   wherein the second base contacts the first base.

2. The heat dissipating device of claim 1, wherein the first and second bases are respectively perpendicular to the heat spreader.

3. The heat dissipating device of claim 2, wherein the first and second heat sinks each comprise a plurality of parallel fins extending laterally from a side thereof.

4. The heat dissipating device of claim 3, wherein the fins are perpendicular to the first and second bases.

5. The heat dissipating device of claim 1, further comprising an additional heat pipe juxtaposed to the heat pipe.

6. The heat dissipating device of claim 5, wherein the first base forms a protrusion portion, the second base defines a recess portion, the additional heat pipe is sandwiched between the protrusion and the recess portion.

7. The heat dissipating device of claim 1, further comprising a fan mounted on the radiator via a pair of clips.

8. The heat dissipating device of claim 7, wherein each clip comprises a body being located on the second heat sink, and a tab perpendicularly extending from the body for fixing the fan onto the first heat sink and the second heat sink.

9. A heat dissipating device comprising:
   a heat spreader;
   a radiator comprising a base and a plurality of fins extending outwardly from a pair of opposite sides of the base;
   a pair of clips secured to another pair of opposite sides of the base;
   a fan mounted onto the radiator via the clips; and
   a heat pipe transferring heat from the heat spreader to the base.

10. The heat dissipating device of claim 9, wherein the base is positioned between the heat spreader and the fan.

11. The heat dissipating device of claim 9, wherein the base is perpendicular to the heat spreader.

12. The heat dissipating device of claim 11, wherein the fins are perpendicular to the base and the heat spreader.

13. The heat dissipating device of claim 9, wherein the radiator comprises a first heat sink having a first base, and a second heat sink having a second base.

14. The heat dissipating device of claim 13, further comprising an additional heat pipe juxtaposed to the heat pipe.

15. The heat dissipating device of claim 14, wherein the first base forms a protrusion portion, the second base defines a recess portion, the additional heat pipe is sandwiched between the protrusion and the recess portion.

16. The heat dissipating device of claim 9, wherein each clip comprises a body being located on the radiator, and a tab perpendicularly extending from the body for fixing the fan onto the radiator.

17. A heat dissipating device comprising:
   a heat spreader adapted for contacting with a heat-generating electronic device;
   a first heat sink mounted on the heat spreader and a second heat sink mounted on the heat spreader;
   first and second U-shaped heat pipes each having a horizontal evaporating portion thermally connecting with the heat spreader, and two vertical condensing portions thermally connecting with the first and second heat sinks, the first and second heat sinks having fins laterally extending in opposite directions.

18. The heat dissipating device of claim 17, wherein the heat spreader has ears extending outwardly adapted for fastening the heat dissipating device to a retainer of the heat-generating electronic device.

19. The heat dissipating device of claim 18 further comprising a pair of clips fastened to two side surfaces of one of the first and second heat sinks, and a fan mounted on the clips and be located over a top of the first and second heat sinks.

* * * * *